US005626924A

United States Patent [19]
Ishikawa

[11] Patent Number: 5,626,924
[45] Date of Patent: May 6, 1997

[54] METHOD OF FORMING OXIDE FILM

[75] Inventor: Yoshimitsu Ishikawa, Nagasaki, Japan

[73] Assignee: Sony Corporation, Japan

[21] Appl. No.: 522,658

[22] Filed: Sep. 1, 1995

[30] Foreign Application Priority Data

Sep. 8, 1994 [JP] Japan .................... 6-240592

[51] Int. Cl.$^6$ .............. H05H 1/24; C23C 16/00
[52] U.S. Cl. ............... 427/579; 427/255.3; 427/255.4
[58] Field of Search ................... 427/563, 574, 427/579, 255.3, 255.4

[56] References Cited

U.S. PATENT DOCUMENTS

| | | | |
|---|---|---|---|
| 4,872,947 | 10/1989 | Wang et al. | 427/574 |
| 5,271,972 | 12/1993 | Kwok et al. | 427/579 |
| 5,332,694 | 7/1994 | Suzuki | 437/195 |
| 5,360,646 | 11/1994 | Morita | 427/579 |
| 5,376,590 | 12/1994 | Machida et al. | 437/235 |
| 5,426,076 | 6/1995 | Moghadam | 437/238 |
| 5,459,105 | 10/1995 | Matsuura | 437/195 |
| 5,459,108 | 10/1995 | Doi et al. | 437/238 |
| 5,502,006 | 3/1996 | Kasagi | 437/195 |
| 5,503,882 | 4/1996 | Dawson | 427/579 |

*Primary Examiner*—Marianne Padgett
*Attorney, Agent, or Firm*—Ronald P. Kananen

[57] ABSTRACT

A method of forming an $O_3$-TEOS oxide film, including the steps of supplying a reactant gas into a plasma CVD apparatus in which a waver is stored and applying a plasma generating voltage to form a plasma silicon oxide film on the wafer; performing a hydrophobic process by stopping supply of the reactant gas into the plasma CVD apparatus and application of the plasma generating voltage, introducing TEOS gas into the plasma CVD apparatus to make an atmosphere of the TEOS gas in a process chamber of the plasma CVD apparatus, and allowing the plasma silicon oxide film on the wafer to react with the TEOS gas in the process chamber; and allowing $O_3$ to react with TEOS gas to form an $O_3$-TEOS oxide film on the plasma silicon oxide film subjected to the hydrophobic process. According to this method, the substrate dependency of the $O_3$-TEOS oxide film can be improved without the need for any additional apparatus for hydrophobic treatment of the plasma silicon oxide film and an increase in number of process steps.

13 Claims, 3 Drawing Sheets

METHOD OF FORMING OXIDE FILM

BACKGROUND OF THE INVENTION

1. Field of the Invention

The present invention relates to a method of forming an $O_3$-TEOS oxide film, and more particularly to a method of forming an $O_3$-TEOS oxide film with improved substrate dependency.

2. Description of the Related Art

An $O_3$-TEOS oxide film formed by oxidation of TEOS (Tetraethylorthosilicate, $Si(OC_2H_5)_4$) with $O_3$ exhibits various superior film characteristics in planarization, step coverage, electrical insulation, etc. It has also received attention as an oxide film that can be formed by low-temperature growth at 400° C. or less.

However, in forming an $SiO_2$ film by oxidation of TEOS with $O_3$, the film growth rate is extremely dependent on the property of a substrate layer formed on a substrate. That is to say, the so-called substrate dependency is remarkable. More specifically, the film growth rate of an $SiO_2$ film to be formed by oxidation of TEOS with $O_3$ on a hydrophobic substrate film such as an Si film, Al film, or AP-CVD film (a substrate film incorporating a small quantity of $H_2O$) is different from that on a hydrophilic substrate film such as an $SiO_2$ film formed by thermal oxidation (a substrate film incorporating a large quantity of $H_2O$). That is, the film thickness of the $SiO_2$ film on the hydrophobic substrate film is small, whereas the film thickness of the $SiO_2$ film on the hydrophilic substrate film is large. Further, the film growth rate depends also on the condition of end groups of components constituting the substrate film, thus rendering it unstable.

As described above, the $SiO_2$ film formed by oxidation of TEOS with $O_3$ is non-uniform in film quality and film thickness because of its substrate dependency, thus reducing the subsequent process margin and thus reducing product yield. To cope with this problem, it has been attempted to improve the substrate dependency of the $SiO_2$ film produced using $O_3$-TEOS, by using HMDS (Hexamethyldisilazane, $(Si(CH_3)_3)_2NH$) and ethanol ($C_2H_5OH$) to carry out a treatment of the surface of a hydrophilic substrate film in a manner which renders it hydrophobic.

However, this conventional method requires additional apparatus for the hydrophobic conversion treatment of the substrate film, causing an increase in installation costs and in the number of process steps. Thus, there is a problem of increased operating costs inclusive of labor costs as well as costs involved with the transfer of the substrate between apparatuses.

SUMMARY OF THE INVENTION

It is accordingly an object of the present invention to provide a method of forming an $O_3$-TEOS oxide film improved in its substrate dependency without the need for any additional apparatus to carry out a hydrophobic rendering treatment of a substrate film and an increase in number of process steps.

According to the present invention achieving the above object, there is provided an oxide film forming method comprising the steps of supplying a reactant gas into a plasma CVD apparatus in which a wafer is stored and applying a plasma generating voltage to form a plasma silicon oxide film on the wafer; performing a hydrophobic rendering process comprising the steps of stopping the supply of the reactant gas into the plasma CVD apparatus along with the application of the plasma generating voltage, introducing TEOS gas into the plasma CVD apparatus to fill a process chamber of the plasma CVD apparatus with the TEOS gas, and allowing the plasma silicon oxide film on the wafer to react with the TEOS gas in the process chamber and thus be rendered hydrophobic. This reaction is followed by allowing $O_3$ to react with TEOS gas to form an $O_3$-TEOS oxide film on the plasma silicon oxide film.

Preferably, the method of the present invention further comprises performing a second hydrophobic rendering process prior the formation of the above mentioned $O_3$-TEOS oxide film. This second hydrophobic rendering process comprises the steps of removing the wafer from the plasma CVD apparatus to bring it into contact with atmospheric air, hydrolyzing the TEOS gas which remains adsorbed on the plasma silicon oxide film using the moisture contained in the atmospheric air in a manner which yields ethanol, and allowing the ethanol to react with the plasma silicon oxide film.

Each hydrophobic rendering process proceeds at relatively low temperatures, so that a plasma CVD apparatus capable of performing the process at low temperatures can be used.

The plasma CVD apparatus employed in applying the method of the present invention is an apparatus for forming the plasma silicon oxide film. The plasma CVD apparatus may be of various kinds including an electrodeless discharge type (inductive coupling type), a two-electrode discharge type, or an ECR plasma CVD apparatus. Further, a power source for applying the plasma generating voltage may be a high-frequency power source or a microwave power source, for example.

An apparatus for forming the $O_3$-TEOS oxide film is usually an apparatus different from the type of plasma CVD apparatus used for forming the plasma silicon oxide film, e.g., an atmospheric-pressure CVD apparatus. Further, the wafer having a plasma silicon oxide film, which is subjected to the hydrophobic characteristic rendering process, is transferred to a separate apparatus from the plasma CVD apparatus.

The reactant gas for forming the plasma silicon oxide film as a substrate layer for the $O_3$-TEOS oxide film is not limitative. For example, the combination of silane ($SiH_4$) and $N_2O$ or the combination of TEOS gas and $O_2$ gas may be employed as the reactant gas. However, the combination of TEOS gas and $O_2$ gas is preferable because TEOS gas is used in the hydrophobic rendering process which follows the step of forming the plasma silicon oxide film.

The time required to introduce the TEOS gas into the process chamber depends on the size and configuration of the process chamber but is usually set to about 40 to 100 sec. Further, the flow rate of the TEOS gas also depends on the size and configuration of the process chamber. However, this flow rate is usually set to 250 sccm (including a flow rate of bubbling He of 13.5 sccm in terms of TEOS gas).

According to the hydrophobic rendering process according to the method of the present invention, a Si-O-Si $(OC_2H_5)$ n(n<4) bond is formed on the surface of the plasma silicon oxide film by a condensation reaction between Si-OH on the oxide film surface and the TEOS gas (molecular $Si(OC_2H_5)_4$). Accordingly, the surface of the plasma silicon oxide film becomes (viz., is rendered) hydrophobic, thereby improving the substrate dependency of the $O_3$-TEOS oxide film to be formed later.

According to the second hydrophobic rendering process in the method of the present invention, the TEOS gas (molecules) adsorbed on the plasma silicon oxide film is hydrolyzed by the moisture ($H_2O$) contained in the atmospheric air during the transfer of the wafer from the plasma CVD apparatus to the next apparatus in which the $O_3$-TEOS oxide film is formed. E.g., during the transfer of a cassette (in which the wafer is disposed) between the different pieces of apparatus. During this transfer, the TEOS gas is converted into ethanol ($C_2H_5OH$) via hydrolysis. As a result, a Si—$OC_2H_5$ bond is formed on the surface of the plasma silicon oxide film by the condensation reaction between Si—OH on the oxide film surface and the ethanol produced by the hydrolysis. Accordingly, the surface of the plasma silicon oxide film becomes hydrophobic, thereby improving the substrate dependency of the $O_3$-TEOS oxide film to be formed later.

Accordingly, after forming the plasma silicon oxide film (P-TEOS oxide film) as a substrate layer for the $O_3$-TEOS oxide film, the hydrophobic converting or rendering process using the TEOS gas can be carried out on the wafer in the same process chamber as that used for the formation of the plasma silicon oxide film. As a result, the substrate dependency of the $O_3$-TEOS oxide film can be improved without the need for any additional apparatus to be specifically provided for the hydrophobic rendering treatment of the plasma silicon oxide film, and without an increase in the number of process steps.

DETAILED DESCRIPTION OF THE PREFERRED EMBODIMENTS

A preferred embodiment of the present invention will now be described in detail with reference to the attached drawings.

Figure 1:
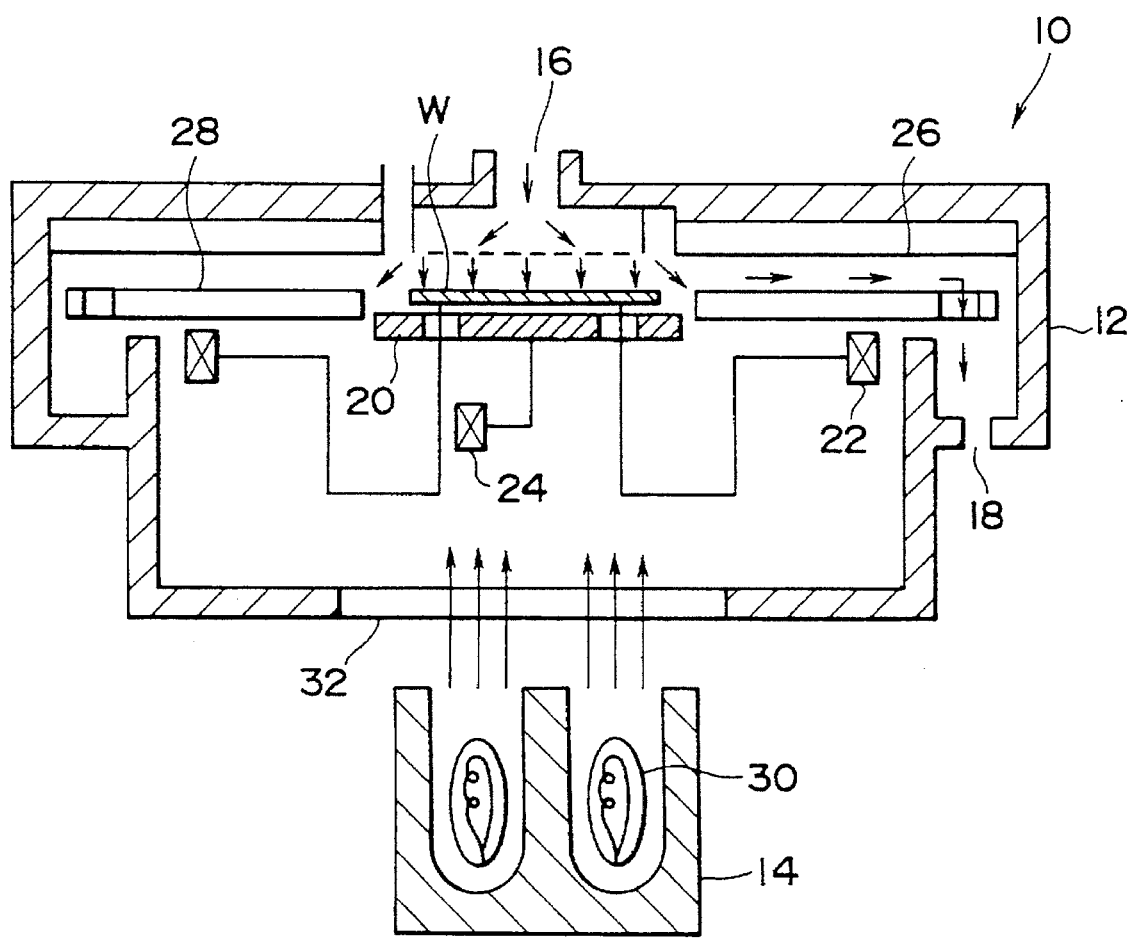
FIG. 1 is a schematic sectional view showing the configuration of a plasma CVD apparatus used to form a plasma silicon oxide film according to the method of the present invention.

FIG. 1 is a schematic sectional view showing the configuration of a plasma CVD apparatus 10 used to form a plasma silicon oxide film using the method according to the present invention. The plasma CVD apparatus (which will be hereinafter referred to simply as the apparatus) 10 is composed of a process chamber (which will be hereinafter referred to simply as a chamber) 12 for storing a wafer W, a heat source 14, and a high-frequency power source (not shown).

The chamber 12 is formed at its upper central portion with a gas inlet 16 for introducing a reactant gas which is to be converted into a plasma, and is also formed at its side with a vacuum exhaust outlet 18 for exhausting excess reactant gas in a manner which maintains a reduced pressure within the chamber 12. At the center of the interior of the chamber 12, is a vertically movable susceptor 20 for holding the waver W and a wafer lifting/lowering mechanism 22 for lifting the wafer W from the susceptor 20 and lowering the wafer W to the susceptor 20. In FIG. 1, reference numeral 24 denotes a mechanism for moving the susceptor 20 both laterally and vertically; reference numeral 26 denotes a ceramic shield; and reference numeral 28 denotes a pumping plate.

The heat source 14 is constructed of a lamp module incorporating a heating lamp 30. The heating lamp 30 heats the chamber 12 via a quartz lamp window 32.

A preferred embodiment of the method of the present invention using the above apparatus 10 will now be described.

Similar to the prior art, the wafer W is put into the chamber 12 and is placed on the susceptor 20. Then, the chamber 12 is evacuated via the vacuum exhaust outlet 18 to adjust the pressure in the chamber 12 to a predetermined level. Then, a reactant gas consisting of TEOS gas and $O_2$ gas is introduced and converted into a plasma by applying a high-frequency voltage. A plasma silicon oxide film is thereby formed on the wafer W using plasma deposition.

After forming a predetermined thickness of the plasma silicon oxide film on the wafer W, a hydrophobic rendering process for the plasma silicon oxide film is initiated. The hydrophobic process is carried out in the following manner. First, both the supply of the $O_2$ gas and the application of the high-frequency voltage are stopped, while the supply of TEOS gas alone continues to be introduced into the chamber 12. The interior of the chamber 12 is maintained filled with the TEOS gas for a predetermined period of time, thus exposing the plasma silicon oxide film on the wafer W, to the TEOS gas. The pressure and temperature in the chamber 12, as well as the flow rate of the TEOS gas used in this hydrophobic rendering process are the same as those in the process for forming the plasma silicon oxide film. The time required to perform the hydrophobic rendering process is set to about 40 to 100 sec, usually, about 60 sec.

After completing this hydrophobic converting or rendering process, the wafer W is removed from the apparatus 10, disposed in a cassette and transported to an $O_3$-TEOS oxide film forming apparatus, e.g., an atmospheric-pressure CVD apparatus, to form an $O_3$-TEOS oxide film in the conventional manner.

A more preferred embodiment of the method of the present invention further includes a second hydrophobic rendering process which is performed by allowing the wafer W, which has been removed from the plasma CVD apparatus, to come into contact with atmospheric air. This allows the TEOS gas which remains adsorbed on the plasma silicon oxide film on the wafer W, to be hydrolyzed by the moisture contained in the atmospheric air in a manner which forms ethanol. This ethanol subsequently reacts with the plasma silicon oxide film.

The hydrophobic rendering process for the oxide film surface in the present invention involves a process wherein a Si—O—Si$(OC_2H_5)_n$ (n<4) bond is formed on the oxide film surface using a condensation reaction between Si—OH on the oxide film surface and the TEOS gas (molecular Si$(OC_2H_5)_4$). Further, the second hydrophobic rendering process involves forming a Si—$OC_2H_5$ bond on the oxide film surface using a condensation reaction between Si—OH on the oxide film surface and ethanol ($C_2H_5OH$) yielded by the hydrolysis of the TEOS gas (molecule) that remains adsorbed on the oxide film surface, by the moisture contained in the atmospheric air.

Each hydrophobic rendering process proceeds at relatively low temperatures, e.g., about 400 °C., so that a plasma CVD apparatus can be used to perform the process.

As mentioned above, the plasma CVD apparatus employed in applying the method of the present invention is an apparatus for forming the plasma silicon oxide film. The plasma CVD apparatus may be of various kinds including an electrodeless discharge type (inductive coupling type), a two-electrode discharge type, and an ECR plasma CVD apparatus. Further, a power source for applying the plasma generating voltage may be a high-frequency power source or a microwave power source, for example.

The apparatus for forming the $O_3$-TEOS oxide film is usually an apparatus different from the plasma CVD apparatus for forming the plasma silicon oxide film, e.g., an atmospheric-pressure CVD apparatus. The wafer having the plasma silicon oxide film which has been subjected to the hydrophobic rendering process is transferred from the plasma CVD apparatus to the above different apparatus.

As described above, according to the hydrophobic rendering process of the present invention, a Si—O—Si $(OC_2H_5)n$ (n<4) bond is formed on the surface of the plasma silicon oxide film by the condensation reaction between Si—OH on the oxide film surface and the TEOS gas (molecular $Si(OC_2H_5)_4$). Accordingly, the surface of the plasma silicon oxide film becomes hydrophobic (viz., is rendered hydrophobic), thereby improving the substrate dependency of the $O_3$-TEOS oxide film to be formed later.

According to the second hydrophobic rendering process of the present invention, the TEOS gas (molecule) adsorbed on the plasma silicon oxide film is hydrolyzed by the moisture ($H_2O$) contained in the atmospheric air during a transfer of the wafer from the plasma CVD apparatus to another apparatus for forming the $O_3$-TEOS oxide film, e.g., transfer using a wafer storing cassette. The TEOS gas is converted into ethanol ($C_2H_5OH$) by the hydrolysis. As a result, a Si—$OC_2H_5$ bond is formed on the surface of the plasma silicon oxide film by the condensation reaction between Si—OH on the oxide film surface and the ethanol. Accordingly, the surface of the plasma silicon oxide film becomes hydrophobic, thereby improving the substrate dependency of the $O_3$-TEOS oxide film to be formed later.

Accordingly, after forming the plasma silicon oxide film (P-TEOS oxide film) as a substrate layer for the $O_3$-TEOS oxide film, the hydrophobic rendering process by the TEOS gas can be carried out on the wafer in the same process chamber as that used for the formation of the plasma silicon oxide film. As a result, the substrate dependency of the $O_3$-TEOS oxide film can be improved without the need for any additional pieces of apparatus specifically for the hydrophobic rendering treatment of the plasma silicon oxide film and without any unnecessary increase in number of process steps.

Test using the Method of the Invention

An experimental test was made to evaluate the effectiveness of the method of the present invention.

Figure 2:
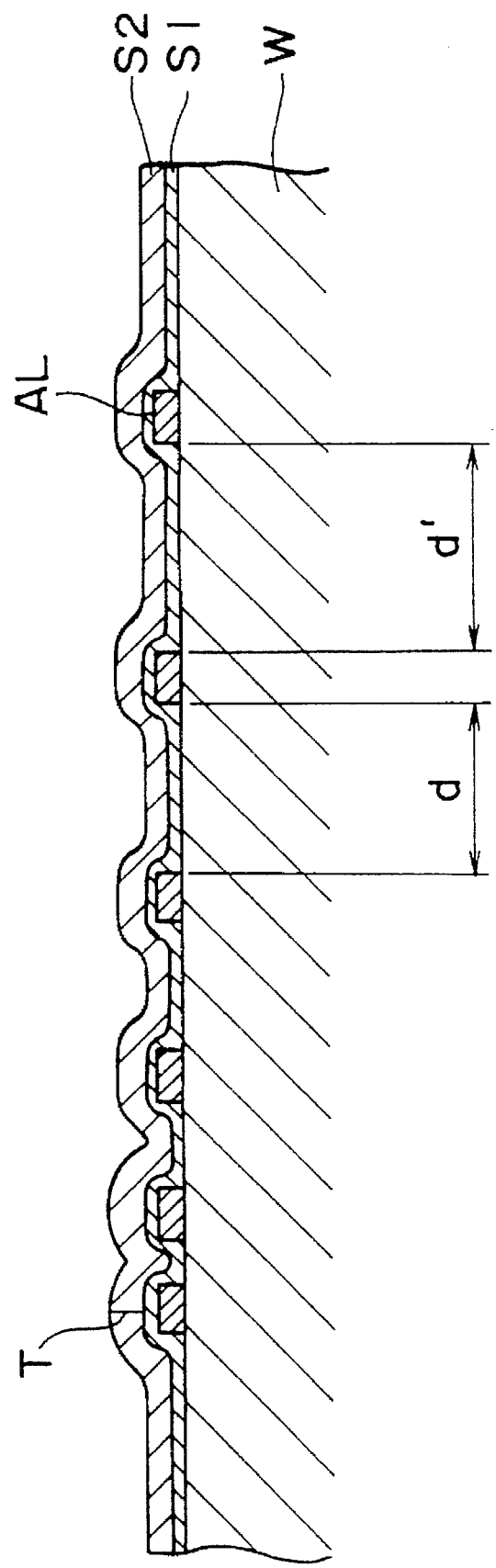
FIG. 2 is a schematic view showing a cross-section of an $O_3$-TEOS oxide film formed using the present invention.

As shown in FIG. 2, a plurality of aluminum wiring layers AL each having a width of 0.5 µm and a thickness of 0.65 µm were formed in parallel with each other on a wafer W, and with a space width (d, d') between the adjacent layers AL being changed in the range of 1 µm to 5 µm.

Then, the wafer W on which the aluminum wiring layers AL had been formed, was put into the above-mentioned apparatus 10, and a reactant gas consisting of TEOS gas and $O_2$ gas was used to form a plasma silicon oxide film S1 having a thickness of 0.3 µm on the aluminum wiring layers AL. Then, the hydrophobic process using TEOS gas was carried out on the plasma silicon oxide film S1. Then, an $O_3$-TEOS oxide film (NSG) S2 which was formed on the plasma silicon oxide film S1, was subjected to the hydrophobic process in an atmospheric-pressure CVD apparatus.

Figure 3:
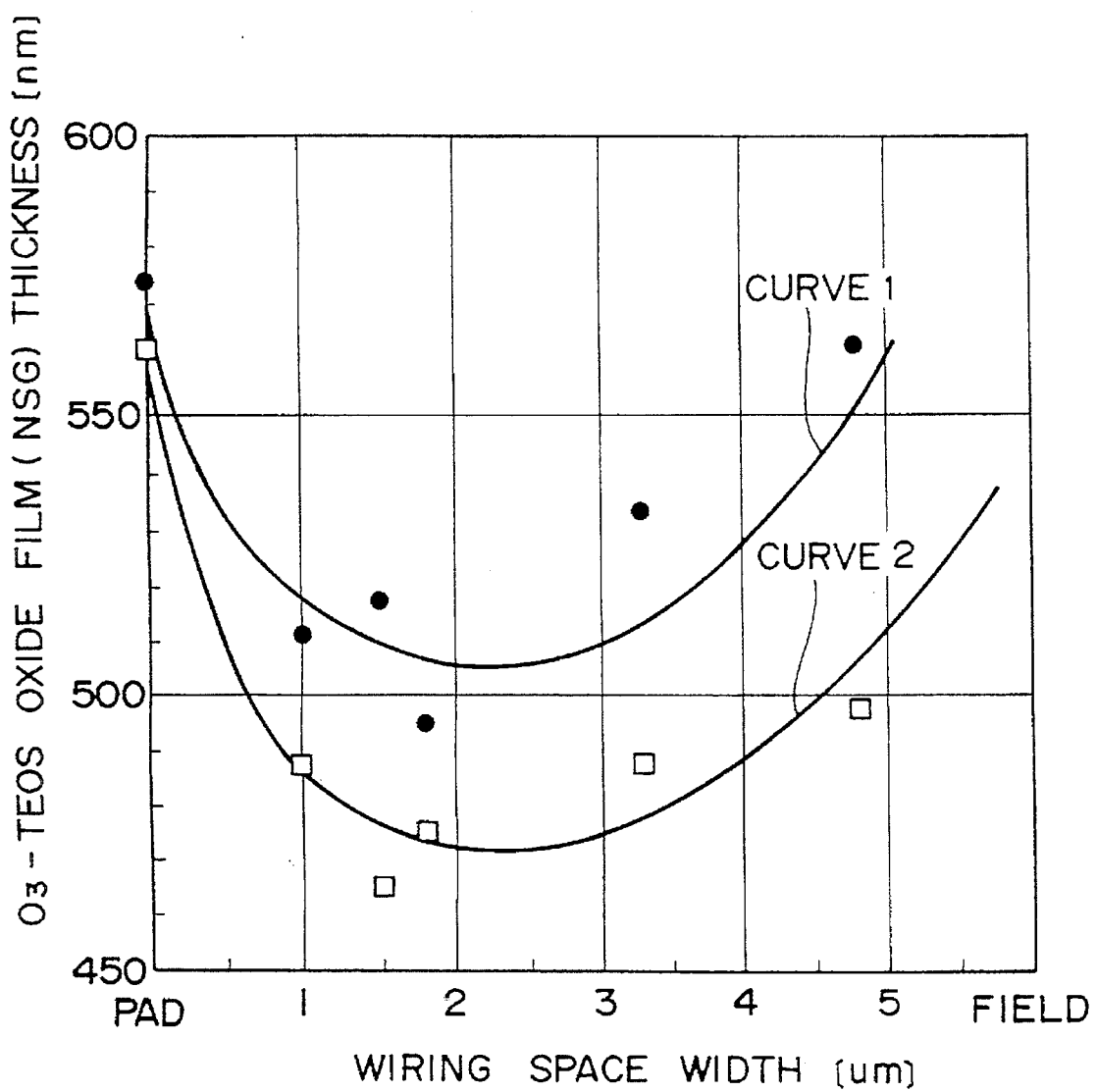
FIG. 3 is a graph showing the relation between a wiring space width and an $O_3$-TEOS oxide film (NSG) thickness.

Conditions of Film Formation of Plasma Silicon Oxide Film:
 Pressure: 9 Torr
 Temperature: 370° C.
 Reactant Gas Flow Rate:
  TEOS gas: 250 sccm (including a flow rate of bubbling He)
  $O_2$ gas: 200 sccm
 Time: 20 sec
 Power Output: 400 W
Conditions of Hydrophobic Process:
 Pressure: 9 Torr
 Temperature: 370° C.
 Reactant Gas Flow Rate:
  TEOS gas: 250 sccm (including a flow rate of bubbling He)
Conditions of Film Formation of $O_3$-TEOS Oxide Film:
 Pressure: atmospheric pressure
 Temperature: 380° C.
 Reactant Gas Flow Rate:
  TEOS gas: 13.5 sccm
  $O_2/O_3$: 6.65 slm The thickness (shown by T in FIG. 2) of the $O_3$-TEOS oxide film formed on each aluminum wiring layer AL varies with a change in wiring space width as shown by the symbols of closed circles in FIG. 3. In FIG. 3, Curve 1 shows an approximation curve of the film thickness varying with the change in wiring space width.

Test using Conventional Method

For the sake of comparison with the method of the present invention, an $O_3$-TEOS oxide film was formed using the conventional method. That is, under the same conditions as those of the above test on the method of the present invention, a silicon oxide film S1 having a thickness of 0.3 µm was formed on the aluminum wiring layers AL. Then, an $O_3$-TEOS oxide film (NSG) S2 was formed in the atmospheric-pressure CVD apparatus without performing the hydrophobic rendering process.

The thickness (shown by T in FIG. 2) of the $O_3$-TEOS oxide film formed on each aluminum wiring layer AL varies with a change in wiring space width as shown by the symbols of open squares in FIG. 3. In FIG. 3, Curve 2 shows an approximation curve of the film thickness varying with the change in wiring space width.

In the case of the conventional method, it is apparent from FIG. 3 that the thickness of the $O_3$-TEOS oxide film at its thinnest portion is reduced by about 18% from the thickness at the reference pad portion. To the contrary, in the case of applying the method of the present invention, it is apparent from FIG. 3 that the thickness of the $O_3$-TEOS oxide film even at its thinnest portion is reduced merely by about 14% as compared with that of the pad portion.

As the result, it can be asserted that the method of the present invention is such as to remarkably improve the substrate dependency of the $O_3$-TEOS oxide film over that possible with the conventional method.

As described above, according to the present invention, the hydrophobic rendering process is carried out on a silicon oxide film in the same plasma CVD apparatus in which the silicon oxide film has been previously formed. Accordingly, the substrate dependency of an $O_3$-TEOS oxide film to be later formed on the silicon oxide film can be remarkably improved.

The method of the present invention can eliminate the need for any additional apparatus for hydrophobic rendering treatment of the substrate film surface as conventionally required. Accordingly, the hydrophobic process for the oxide film formed on the substrate can be performed without an increase in number of process steps, with the result that the improvement in substrate dependency of the $O_3$-TEOS oxide film can be realized without an increase in chip cost.

What is claimed:

1. An oxide film forming method comprising the steps of:
   supplying a reactant gas into a plasma chemical vapor deposition (CVD) apparatus in which a wafer is disposed and applying a plasma generating voltage to form a first silicon oxide film on said wafer;
   performing a first hydrophobic rendering process on the first silicon oxide film comprising the steps of:
   stopping the supply of said reactant gas into said plasma CVD apparatus;
   stopping the application of said plasma generating voltage;
   introducing tetraethylorthosilicate (TEOS) gas into said plasma CVD apparatus to establish an atmosphere of said TEOS gas in a process chamber of said plasma CVD apparatus, and allowing the first silicon oxide film on said wafer to react with said TEOS gas in said process chamber for a predetermined time to allow a condensation reaction between Si—OH on a surface of the first silicon oxide film, and said TEOS gas to impart hydrophobic characteristics on the first silicon oxide film; and
   reacting $O_3$ with the TEOS gas to form a second oxide film on said first silicon oxide film after the first silicon oxide film has been rendered hydrophobic by the condensation reaction between the Si—OH on the surface of the first silicon oxide film and the TEOS gas.

2. An oxide film forming method according to claim 1, further comprising the step of performing a second hydrophobic rendering process before the step of reacting $O_3$ with the TEOS gas to form the second silicon oxide film, the second hydrophobic rendering process comprising:
   permitting the TEOS gas to adsorb onto the surface of the first silicon oxide film;
   removing said wafer from said plasma CVD apparatus;
   exposing said wafer to moisture containing atmospheric air;
   hydrolyzing the TEOS gas adsorbed on said first silicon oxide film with a moisture contained in said atmospheric air to yield ethanol; and
   allowing said ethanol to react with said first silicon oxide film.

3. An oxide film forming method according to claim 1, wherein process conditions for the first hydrophobic rendering process are set to a pressure of 9 Torr, a temperature of 370° C., a flow rate of said TEOS gas of 250 sccm, and a time of 40 to 100 sec.

4. An oxide film forming method according to claim 3, wherein said flow rate of said TEOS gas includes a flow rate of bubbling He.

5. An oxide film forming method according to claim 1, wherein said reactant gas comprises $SiH_4$ and $N_2O$.

6. An oxide film forming method according to claim 1, wherein conditions for the second oxide film formation are set to atmospheric pressure, a temperature of 380° C., a flow rate of the TEOS gas of 13.5 sccm, and a flow rate of $O_2/O_3$ of 6.65 slm.

7. An oxide film forming method comprising the steps of:
   supplying a reactant gas into a plasma chemical vapor deposition (CVD) apparatus in which a wafer is disposed and applying a plasma generating voltage to form a first silicon oxide film on said wafer;
   performing a first hydrophobic rendering process on the first silicon oxide film comprising the steps of:
   stopping the supply of said reactant gas into said plasma CVD apparatus;
   stopping the application of said plasma generating voltage;
   introducing tetraethylorthosilicate (TEOS) gas into said plasma CVD apparatus to establish an atmosphere of said TEOS gas in a process chamber of said plasma CVD apparatus, and allowing the first silicon oxide film on said wafer to react with said TEOS gas in said process chamber for a predetermined time to allow a condensation reaction between Si—OH on a surface of the first silicon oxide film, and said TEOS gas to impart hydrophobic characteristics on the first silicon oxide film;
   reacting $O_3$ with the TEOS gas to form a second oxide film on said first silicon oxide film after the first silicon oxide film has been rendered hydrophobic by the condensation reaction between the Si—OH on the surface of the first silicon oxide film and the TEOS gas; and wherein said reactant gas comprises $SiH_4$ and $N_2O$.

8. An oxide film forming method comprising the steps of:
   supplying a reactant gas into a plasma CVD apparatus in which a wafer is stored and applying a plasma generating voltage to form a first plasma silicon oxide film on said wafer;
   performing a first hydrophobic rendering process comprising the steps of:
   stopping supply of said reactant gas into said plasma CVD apparatus and stopping application of said plasma generating voltage, introducing tetraethylorthosilicate TEOS gas into said plasma CVD apparatus to fill a process chamber of the plasma CVD apparatus with an atmosphere of said TEOS gas and allowing said plasma silicon oxide film on said wafer to react with said TEOS gas in said process chamber and to adsorb the TEOS gas;
   removing said wafer from said plasma CVD apparatus and disposing said wafer in a cassette;
   transporting said wafer disposed in said cassette to a second CVD apparatus; and
   allowing $O_3$ to react with the TEOS gas in said second CVD apparatus to form a second oxide film on said first plasma silicon oxide film subjected to said first hydrophobic rendering process.

9. An oxide film forming method according to claim 8, further comprising the steps of performing a second hydrophobic rendering process comprising the steps of:
   removing said wafer from said plasma CVD apparatus and exposing said wafer to moisture containing atmospheric air prior to the step of forming the second oxide film;
   hydrolyzing the TEOS gas adsorbed on said first plasma silicon oxide film with moisture contained in said atmospheric air to yield ethanol; and
   allowing said ethanol to react with said plasma silicon oxide film.

10. An oxide film forming method comprising the steps of:
    supplying a reactant gas into a plasma chemical vapor deposition (CVD) apparatus in which a wafer is stored and applying a plasma generating voltage to form a first plasma silicon oxide film on said wafer;
    performing a first hydrophobic rendering process comprising the steps of:
    stopping supply of said reactant gas into said plasma CVD apparatus and stopping application of said plasma generating voltage, introducing tetraethylorthosilicate (TEOS) gas into said plasma CVD apparatus to fill a process chamber of the plasma CVD apparatus with an atmosphere of said TEOS gas, and allowing said plasma silicon oxide film on said wafer to react with said TEOS gas in said process chamber and to adsorb the TEOS gas;

removing said wafer from said plasma CVD apparatus and disposing said wafer in a cassette;

transporting said wafer disposed in said cassette to a second CVD apparatus;

allowing $O_3$ to react with the TEOS gas in said second CVD apparatus to form a second oxide film on said first plasma silicon oxide film subjected to said first hydrophobic rendering process; and wherein process conditions for said first hydrophobic rendering process are set to a pressure of 9 Torr, a temperature of 370° C, a flow rate of said TEOS gas of 250 sccm, and a time of 40 to 100 sec.

11. An oxide film forming method according to claim 10, wherein said flow rate of said TEOS gas includes a flow rate of bubbling He.

12. An oxide film forming method comprising the steps of:

supplying a reactant gas comprised of a mixture of $SiH_4$ and $N_2O$ into a reaction chamber of a plasma chemical vapor deposition (CVD) apparatus in which a wafer is disposed;

applying a plasma generating voltage to plasmatize the reagent gas and to chemically vapor-deposit a first silicon oxide film on said wafer;

stopping both the supply of said reactant gas into said plasma CVD apparatus and the application of said plasma generating voltage to stop the deposition of the first silicon oxide film;

introducing tetraethylorthosilicate (TEOS) gas into said plasma CVD apparatus to fill the process chamber in which the wafer is disposed, with the TEOS gas;

allowing the first silicon oxide film on said wafer to react with said TEOS gas in said process chamber for a predetermined time sufficient to allow a condensation reaction between Si—OH on a surface of the first silicon oxide film, and said TEOS gas, and to impart predetermined hydrophobic characteristics on the first silicon oxide film; and reacting $O_3$ with the TEOS gas to chemically vapor-deposit a second oxide film on said first silicon oxide film after the first silicon oxide film has been rendered hydrophobic by the condensation reaction between the Si—OH on the surface of the first silicon oxide film and the TEOS gas.

13. A method of rendering an oxide film hydrophobic in a manner which provides predetermined substrate dependency characteristics and facilitates a subsequent formation of a silicon oxide film, comprising the steps of:

supplying a reactant gas comprised of a mixture of tetraethylorthosilicate (TEOS) gas and oxygen ($O_2$) into a process chamber of a plasma chemical vapor deposition (CVD) apparatus in which a wafer is disposed, and applying a plasma generating voltage to chemically vapor-deposit a first silicon oxide film on the wafer;

stopping the supply of the $O_2$ gas into the plasma CVD apparatus and stopping the application of the plasma generating voltage to stop the deposition of the first silicon oxide film;

continuing the supply of the TEOS gas into the plasma CVD apparatus to completely fill the process chamber in which the wafer is disposed, with the TEOS gas;

allowing the TEOS gas to adsorb onto a surface of the first silicon oxide film and for the TEOS gas to react with the first silicon oxide film for a predetermined time sufficient to allow a condensation reaction between Si—OH on a surface of the first silicon oxide film, and the TEOS gas;

exposing the wafer to moisture containing atmospheric air;

hydrolyzing the TEOS gas adsorbed on the first silicon oxide film with the moisture contained in the atmospheric air to yield ethanol; and allowing the ethanol to react with the first silicon oxide film.

* * * * *